(12) United States Patent
Nanataki et al.

(10) Patent No.: US 7,518,131 B2
(45) Date of Patent: Apr. 14, 2009

(54) ELECTRON BEAM IRRADIATING APPARATUS

(75) Inventors: Tsutomu Nanataki, Toyoake (JP); Iwao Ohwada, Nagoya (JP); Yuki Bessho, Nishikasugai-Gun (JP); Takayoshi Akao, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 298 days.

(21) Appl. No.: 11/385,483

(22) Filed: Mar. 21, 2006

(65) Prior Publication Data

US 2007/0040130 A1 Feb. 22, 2007

Related U.S. Application Data

(60) Provisional application No. 60/709,662, filed on Aug. 19, 2005.

(30) Foreign Application Priority Data

Feb. 23, 2006 (JP) ............................. 2006-046350

(51) Int. Cl.
*A61N 5/00* (2006.01)
(52) U.S. Cl. .................................................. 250/492.3
(58) Field of Classification Search ............... 250/492.3, 250/492.1, 492.2
See application file for complete search history.

(56) References Cited

U.S. PATENT DOCUMENTS

| | | | | |
|---|---|---|---|---|
| 3,818,375 | A * | 6/1974 | Stapleton et al. | 372/74 |
| 4,960,753 | A * | 10/1990 | Collins et al. | 204/298.06 |
| 6,249,080 | B1 * | 6/2001 | Komoda et al. | 313/310 |
| 6,750,461 | B2 * | 6/2004 | Fink et al. | 250/492.3 |
| 6,891,176 | B2 * | 5/2005 | Viscor et al. | 250/492.24 |
| 6,936,551 | B2 * | 8/2005 | Moghadam et al. | 438/780 |
| 2006/0290291 | A1 * | 12/2006 | Aizawa | 315/169.4 |
| 2007/0278928 | A1 * | 12/2007 | Lee et al. | 313/420 |

* cited by examiner

*Primary Examiner*—Kiet T Nguyen
(74) *Attorney, Agent, or Firm*—Burr & Brown

(57) ABSTRACT

An electron beam irradiating apparatus includes a chamber being kept under vacuum, and housing a planar electron emitting element and a positioning unit and an object to be irradiated is directly irradiated with an electron beam emitted from the element. The planar electron emitting element includes: an emitter portion composed of a dielectric material; and a first electrode and a second electrode applied with a driving voltage for emitting electrons, and the first electrode is formed on a first surface of the emitter portion and has a plurality of through-holes where the emitter portion is exposed, a surface of the first electrode facing to the emitter portion around the through-holes is separated from the emitter portion, and the electron beam is emitted from the first surface of the emitter portion through the through-holes.

17 Claims, 8 Drawing Sheets

ELECTRON BEAM IRRADIATING APPARATUS

BACKGROUND OF THE INVENTION

1. Field of the Invention

The present invention relates to an electron beam irradiating apparatus for generating an electron beam and applying the generated electron beam to an object to be irradiated to change physical properties of the object to be irradiated.

2. Description of the Related Art

In recent years, there have been placed great expectations on an electron beam irradiating apparatus. The electron beam irradiating apparatus may be used as means for sterilizing drinking water or decomposing and removing harmful substances as well as means that contributes to our safety and health. This apparatus has recently come to play an important role especially in a semiconductor manufacturing process. This is because existing techniques face limit in increasing an integration degree of devices and improving an operational speed of the devices while following a conventional manufacturing method using a photolithography step (resist coating, pattern exposure, etching, and resist removal), and as a countermeasure against this drawback, a technique of applying an electron beam (EB) is regarded as promising (see "Nikkei MICRODEVICE" October 2002, pp. 119-128, for instance).

The conceivable use of an electron beam irradiating apparatus used in a semiconductor manufacturing process is to improve an intermediate insulating film, for example. Regarding devices having a design rule on the order of 100 nm or smaller, a wiring material has been shifted from aluminum and tungsten to copper, and a low-dielectric-constant film (also referred to as "Low-k film) has been adopted as an interlayer (interline) insulating film for increasing a speed. However, the dielectric constant of the film is reduced by using a porous film having a low film density, so a film's mechanical strength or interfacial adhesion is important. Hence, an attempt has been made to enhance the strength or adhesion through the process for irradiating the porous film with an electron beam (this process is called "EB curing process" (see "TOSHIBA Review", Vol. 59, No. 8 (2004), pp. 17-21)).

Incidentally, a general electron beam irradiating apparatus adopts a technique of applying electrons through a window foil. In this case, the electron beam irradiating apparatus is structured as follows, for example. The electron beam irradiating apparatus is mainly composed of electron emitting means for generating and emitting an electron beam, a power supply device, and a conveying stage for positioning and moving an object to be irradiated. The electron emitting means has a vacuum chamber for protecting the following filament from damages, and a window portion for emitting the electron beam provided to the vacuum chamber. On the other hand, the conveying stage is placed outside the vacuum chamber to apply the electron beam emitted from the window portion to the object to be irradiated. The electron emitting means has a terminal for generating the electron beam provided in the vacuum chamber. The terminal has the filament as a cathode for emitting thermions, and a grid for controlling the thermions generated with the filament. The window portion has a window foil and a window structure. The window foil separates a vacuum atmosphere from a non-vacuum atmosphere in the vacuum chamber. The electron beam is emitted to the outside of the vacuum chamber through the window foil. Thus, as a material for the window foil, a high-strength titanium foil or silicon thin film is used.

However, the above conventional electron beam irradiating apparatus has the following problems to be solved.

Firstly, there is a problem in that an electron beam (thermion) is irradiated from one filament in many cases and thus, a irradiation range is narrow. To overcome this problem, the irradiation range may be widened by scanning a target with the electron beam to thereby apply the beam to a desired portion. However, in this case, electrons are applied with an energy more than required. Accordingly, a large amount of electrons pass through the object to be irradiated to cause a problem of low efficiency. Further, there are problems in that the apparatus structure has to be complicated for scanning and in that the power supply device needs to be upsized for applying the beam with the high energy, and it is also necessary to shield an X-ray resulting therefrom.

To solve the above problem of the narrow irradiation range, as shown in FIG. 6, there has been proposed an electron beam irradiating apparatus where a number of filaments and grids are provided in the terminal to ensure a wide irradiation range (see the IWASAKI ELECTRIC homepage at the Internet URL: http://www.iwasaki.co.jp/product/applied optics field/hbw system/index.html (a search was made online for this specification on Aug. 1, 2005). However, in practice, the numbers of filaments and grids that may be provided inside the terminal are limited. The electron beams (thermions) are radially emitted and thus, an amount of electron beams varies depending on an irradiation region. This leads to another problem that the physical property of the object to be irradiated which would be changed as a result of irradiation with the electron beam is not always made uniform to a sufficient degree.

Secondarily, there is a problem in that electrons pass through the titanium foil, so a high energy is necessary for emitting the electrons, with the result that the apparatus is upsized and complicated. Further, it is desirable in consideration of efficiency that the emitted electron beam is applied to the object to be irradiated with no loss, and all energy is consumed by the object to be irradiated to avoid wasteful transmission of the electron beam. However, there is a problem in that the electrons are transmitted through the titanium film, so an amount of energy necessary for electron emission is regulated during passing through the film, making it substantially impossible to adjust energy to be consumed by the object to be irradiated.

On the other hand, as an example of the conventional electron beam irradiating apparatuses, an electron beam irradiating apparatus having a window portion and devised to uniformly irradiate the object to be irradiated with an electron beam has been proposed. That is, there has been proposed an electron beam irradiating apparatus having an electron beam tube having a window portion for emitting an electron beam to the outside to process an object to be irradiated using the electron beam emitted from the electron beam tube. In this apparatus, the window portion of the electron beam tube is formed into a linear shape for linearly applying the electron beam emitted from the window portion to the object to be irradiated, and a shielding member for shielding the electron beam is provided in front of the window portion (outside the window portion) in a position facing to a part of the window portion (see JP-A-2002-341100). However, the invention disclosed in JP-A-2002-341100 has the following problem in the case of planarly applying an electron beam to a work W of a large area.

(1) An electron beam emitted from a filament $1a$ is absorbed by a flange $1c$ and a shielding member 5, resulting in an energy loss.

(2) The filament 1a cannot planarly apply an electron beam to an object to be irradiated, so plural devices (filaments 1a) are necessary, resulting in a massive system as a whole.

(3) In the case mentioned in (2) above, an irradiation amount of electron beam is reduced and its distribution becomes non-uniform due to the non-uniformity of the spaces among the plural systems.

SUMMARY OF THE INVENTION

The present invention has been accomplished in view of the above problems of conventional techniques, and accordingly, it is an object of the present invention to provide an electron beam irradiating apparatus capable of efficiently applying an electron beam to a large area with simple configuration and structure. As a result of extensive studies, it is found that the above object can be attained taking the following measure.

An electron beam irradiating apparatus according to the present invention includes: a chamber being kept under vacuum; and an electron emitting element provided inside the chamber and generating and emitting an electron beam to be applied to an object to be irradiated, wherein the electron emitting element is a planar electron emitting element that has a planar electron emitting surface and can planarly apply the electron beam to the object to be irradiated.

More specifically, the electron beam irradiating apparatus is modified as the following two preferred modes (first and second preferred modes).

In the electron beam irradiating apparatus according to the first preferred mode, the object to be irradiated is placed inside the chamber and directly (not through a window portion, that is, a solid film unlike a conventional technique) irradiated with the electron beam emitted from the electron emitting element in a vacuum atmosphere of the chamber, the electron beam irradiating apparatus further includes positioning means for positioning the object to be irradiated in the chamber, the planar electron emitting element includes: an emitter portion composed of a dielectric material; and a first electrode and a second electrode that are applied with a driving voltage for emitting electrons, and the first electrode is formed on a first surface of the emitter portion, the second electrode is formed on a second surface of the emitter portion, at least the first electrode has a plurality of through-holes where the emitter portion is exposed, a surface of the first electrode facing to the emitter portion around the through-holes is separated from the emitter portion, and the electron beam is emitted from at least the first surface of the emitter portion through the through-holes.

In the electron beam irradiating apparatus according to the first preferred mode, the chamber including the planar electron emitting element and the positioning means is kept under vacuum. Thus, the above electron beam irradiating apparatus additionally requires means for evacuating the chamber and keeping its atmosphere vacuum. However, the present invention is not limited thereto, and a vacuum pump may be adopted. Further, a power supply device for applying to the first electrode and the second electrode a driving voltage for emitting electrons is additionally required. It is possible to provide a bulb or pipe for introducing a gas to be allowed to react with the object to be irradiated or a gas to be treated into the vacuum chamber. In this specification, the vacuum atmosphere means an atmosphere having a pressure lower than the atmospheric pressure. The pressure is preferably $10^4$ Pa or less, more preferably 1 Pa or less.

In the electron beam irradiating apparatus according to the first preferred mode, the positioning means for positioning the object to be irradiated is not limited but preferably has a conveying function so as to load/unload the object to be irradiated to/from the chamber. For example, an XY stage or a stage having a rotating mechanism may be used. Further, a fixed (positioned) stage and a conveying mechanism such as a lift or conveyor are independently provided, and the object to be irradiated may be transferred between the stage and the mechanism by means of a robot hand.

In the electron beam irradiating apparatus according to the first preferred mode, the second electrode of the planar electron emitting element preferably has a plurality of through-holes where the emitter portion is exposed, a surface of the second electrode facing to the emitter portion around the through-holes is separated from the emitter portion, and the electron beam is emitted from the first surface and the second surface of the emitter portion. That is, the above electron beam irradiating apparatus preferably emit the electron beam from the two surfaces of the emitter portion. For example, if the emitter portion has a sheet-like shape having two surfaces, an electron beam is emitted from the two surfaces.

In the electron beam irradiating apparatus according to the first preferred mode, the electron beam is preferably emitted in a pulsed form from the planar electron emitting element. In other words, the planar electron emitting element of the electron beam irradiating apparatus preferably emits an electron beam in the pulsed form.

In the electron beam irradiating apparatus according to the first preferred mode, the first surface or the second surface of the emitter portion of the planar electron emitting element, which emits the electron beam is preferably at least one of a curved surface and a polyhedral surface. Incidentally, the polyhedral surface means a surface including a curved portion and a flat portion, or a surface that combines flat portions different in direction.

In the electron beam irradiating apparatus according to the first preferred mode, an average diameter of the through-holes is preferably 0.01 to 100 μm.

In the electron beam irradiating apparatus, an average porosity of the through-holes is 5 to 60%.

Further, in the electron beam irradiating apparatus according to the first preferred mode, at least one of a plurality of the planar electron emitting elements and a plurality of the positioning means are preferably provided in the chamber being kept under vacuum. For example, one planar electron emitting element and two positioning means (objects to be irradiated) may be provided. Further, four planar electron emitting elements and four positioning means (objects to be irradiated) may be provided.

In the electron beam irradiating apparatus according to the second preferred mode, the object to be irradiated is placed in the atmosphere outside the chamber, the chamber includes: a plurality of window portions through which the electron beam is transmitted to the atmosphere and which are provided on a side facing to the object to be irradiated and formed from a thin film; electron accelerating and orbit controlling electrodes arranged around each of the window portions; and an insulating flange portion for fixing and supporting the window portions and the electron accelerating and orbit controlling electrodes with the chamber being kept under vacuum, and the electron beam emitted from the planar electron emitting element is accelerated by the electron accelerating and orbit controlling electrodes, concentratedly guided to the window portions, and transmitted through the window portions and then planarly applied to the object to be irradiated.

In this way, the electron beam emitted from the planar electron emitting elements is guided to the window portion while its orbit is controlled by an electric field generated by the electron accelerating and orbit controlling electrodes.

Hence, the flange or the like is prevented from absorbing the electron beam. Thus, it is possible to effectively avoid an energy loss due to absorption of the electron beam. Further, since the element is a planar electron emitting element, the electron beams are planarly emitted. The window portions are arranged at regular intervals throughout the entire planar electron emitting element. The electron beam that passes through the window portion is diffused to some extent in the atmosphere while colliding with molecules. Based on this, one apparatus may planarly and uniformly apply an electron beam an object to be irradiated.

In the electron beam irradiating apparatus according to the second preferred mode, the window portions are preferably arranged at substantially regular intervals throughout the entire electron emitting surface of the planar electron emitting element.

In the electron beam irradiating apparatus according to the second preferred mode, the insulating flange portion of the chamber preferably has an arch or dome shape that protrudes to a side on which the object to be irradiated is arranged because the electron beam may be efficiently applied to a larger area. Further, the insulating flange portion is formed in an arch or dome shape, so the thickness of the insulating flange portion necessary for maintaining the vacuum atmosphere relative to the atmospheric pressure may be reduced. Hence, a lightweight apparatus may be attained.

In the electron beam irradiating apparatus according to the second preferred mode, the window portion preferably has an arch or dome shape that protrudes to a side on which the object to be irradiated is arranged because the electron beam may be efficiently applied to a larger area similarly to the above case. Further, the window portions are formed in the arch or dome shape, so the thickness of the thin film for the window portion necessary for maintaining the vacuum atmosphere relative to the atmospheric pressure may be reduced. Hence, electrons of low energy can pass through the window portions with no loss.

Further, in the electron beam irradiating apparatus according to the second preferred mode, the plurality of planar electron emitting elements and objects to be irradiated are preferably provided in accordance with each other because the electron beam may be applied to a larger area with no energy loss.

Next, according to the present invention, a film modifying device using the electron beam irradiating apparatus according to any one of the above modes may be provided. The film modifying device according to a preferred mode of the invention applies an electron beam to a film (non-porous film) as the object to be irradiated, and thus may turn the film porous (porous film). Further, according to the preferred mode, an electron beam is applied to the film as the object to be irradiated, whereby the film may be made porous and at least one of the mechanical strength and interfacial adhesion may be improved. Further, according to the preferred mode, the film as the object to be irradiated is a porous film, and the electron beam is applied to the porous film to thereby improve at least one of the mechanical strength and interfacial adhesion of the porous film. As the porous film, a low-dielectric-constant (Low-k film) used as an interlayer insulating film of a semiconductor may be used. Here, the elasticity, modulus value or the like may be illustrated as an example of the mechanical strength. Further, as a material of the low-dielectric-constant film, a known material may be used ("Semiconductor FPD World 2005, 1, p. 60 (published by Press Journal Co. Ltd.).

In the electron beam irradiating apparatus according to the first or second preferred mode, the planar electron emitting element includes: an emitter portion; and a first electrode and a second electrode that are applied with a driving voltage for emitting electrons, and the electron beam is emitted from a surface of the emitter portion through the plurality of through-holes of the (first) electrode. Thus, the electron beam is not limited from one point, and a number of points for emitting the electron beam may be arranged on the plane. Electrons may be emitted from the entire plane. In the electron beam irradiating apparatus according to the first or second preferred mode, an average diameter of the through-holes as the points for emitting electrons in the planar electron emitting element is s preferably 0.01 to 100 μm. An average porosity of the through-holes is 5 to 60%. Accordingly, the irradiation range is wide, and it is unnecessary to widen the irradiation range through scanning with the electron beams. The average diameter of the through-holes is more preferably 0.01 to 1 μm. The average porosity of the through-holes is preferably 30 to 60%. An amount of emitted electron beam may be increased, and the electron beams may be made more uniform. Then, electrons may be emitted and applied with the minimum energy to avoid the wasteful transmission of electrons through the object to be irradiated and increase efficiency.

Further, the electron beam irradiating apparatus according to the first preferred mode of the invention may emit electrons having initial velocity from the surface of the emitter portion, so there is no need to apply an accelerating voltage. Hence, the apparatus may be simplified and downsized. Further, the electron beam irradiating apparatus according to the first and second preferred modes of the invention does not require scanning, and saves energy necessary for irradiation, so the power supply device is made compact. In addition, the process for shielding the X ray is unnecessary, or a simpler process suffices therefor. Moreover, the electron beam is not radially applied to the irradiating range, and the planar electron emitting element emits the beam substantially in parallel to the irradiation range of the object to be irradiated. Hence, it is possible to uniformize the physical properties that would be changed as a result of irradiation with the electron beam.

In addition, a pattern may be directly formed on the object to be irradiated without using an optical system or mask. For example, the (first) electrode for the through-hole for emitting the electron beam is divided (into individual electrodes), for example, and the applied voltage level or application time is adjusted for each electrode. Thus, if an amount of irradiated electron beam or the depth to which the beam reaches is changed depending on an irradiation area, a desired pattern may be formed on the object to be irradiated or desired modification may be carried out. That is, the electron beam irradiating apparatus according to the present invention may function as a pattern drawing apparatus using an electron beam. For example, if a film formed on a wafer is irradiated with the electron beam and modified in the semiconductor manufacturing process, and the wafer of substantially circular shape has the diameter as large as 12 inches or more, the characteristic of the film in a central portion of the wafer may be different from that in a peripheral portion of the wafer. In contrast, according to the electron beam irradiating apparatus of the present invention, as described above, the amount of irradiated electron beam and the depth to which the beam reaches are changed depending on the irradiation range, so the modification degree of the film may be adjusted and thus the non-uniform characteristics of the film before the modification may be made uniform through the modification.

In the electron beam irradiating apparatus according to the first preferred mode of the invention, the planar electron emitting element for generating and emitting an electron beam and positioning means for positioning the object to be irradiated with the electron beam are provided in one chamber that is kept under vacuum, and the electron beam emitted from the planar electron emitting element is applied to the object to be irradiated not through the window portion unlike a conventional electron beam irradiating apparatus. Hence, the beam does not need to pass through a titanium foil (metal foil), so the electrons may be emitted with a lower energy than the conventional one. Thus, the apparatus may be simplified and downsized. Further, since the beam does not pass through the titanium foil, an amount of energy necessary for emitting the electrons is not limited thereby. In addition, in the electron beam irradiating apparatus according to the first and second preferred modes of the present invention, the electron beam is emitted in a pulsed form from the planar electron emitting element, so an energy may be readily adjusted such that the emitted electron beam is applied to the object to be irradiated with no loss to let the object to be irradiated consume all the energy, that is, to avoid wasteful transmission of electron beams.

In the electron beam irradiating apparatus according to the first and second preferred modes of the invention, the electron beam may be emitted from both surfaces of the emitter portion of the planar electron emitting element. Further, in the electron beam irradiating apparatus according to the first preferred mode of the invention, at least one of a plurality of the planar electron emitting elements and a plurality of the positioning means are provided in one chamber that is kept under vacuum. This contributes to an increase in throughout, and the apparatus may be made compact in accordance with the throughput ratio.

In the electron beam irradiating apparatus according to the first and second preferred modes of the invention, the electron-beam emitting surface of the emitter portion of the planar electron emitting element is formed as at least one of a curved surface and a polyhedral surface. Accordingly, it is possible to properly emit an electron beam in accordance with the shape of the object to be irradiated. If the surface to be irradiated of the object to be irradiated is an inner surface of a cylinder or has a complicated shape, physical properties of the object to be irradiated may be uniformly changed.

According to the present invention, it is possible to provide an electron beam irradiating apparatus capable of efficiently applying an electron beam to a large area with a simpler configuration and structure.

DESCRIPTION OF THE PREFERRED EMBODIMENTS

Hereinafter, the present invention will be described based on embodiments with reference to an appropriate one of the accompanying drawings. However, the present invention should not be construed as being limited to these embodiments. The present invention allows various changes, corrections, modifications, and replacements based on the findings of those skilled in the art without departing from the scope of the invention. For example, the drawings show preferred embodiments of the present invention, and the present invention is not limited by the drawings or information of the drawings. In embodying and verifying the present invention, means similar or equivalent to the means described in this specification may be adopted but the following means is preferred means.

Figure 1:
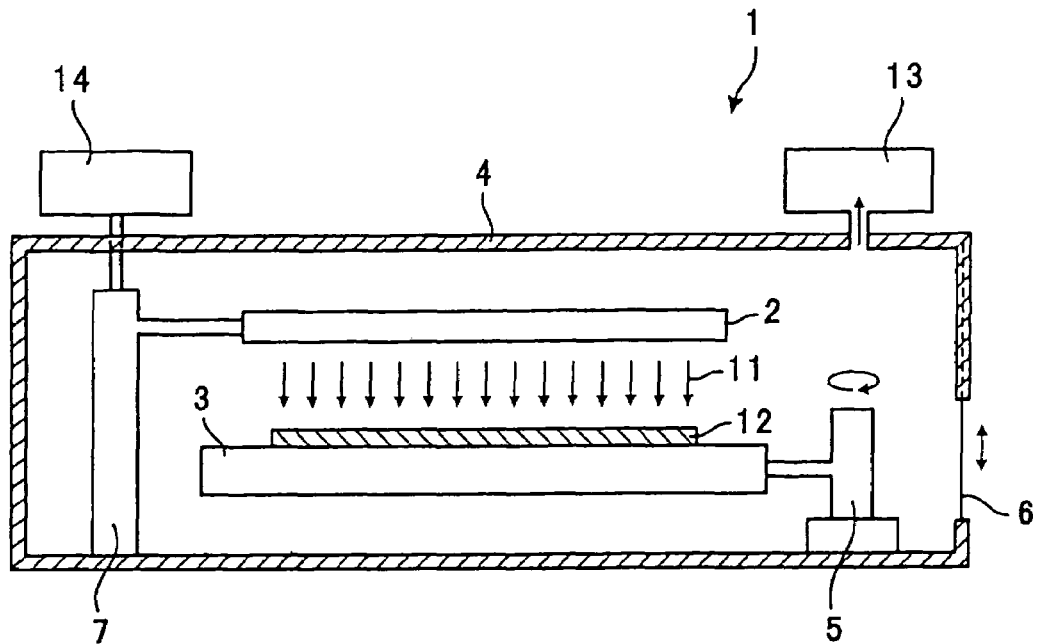
FIG. 1 is a sectional view of an electron beam irradiating apparatus according to a first embodiment of the present invention.
Figure 7:
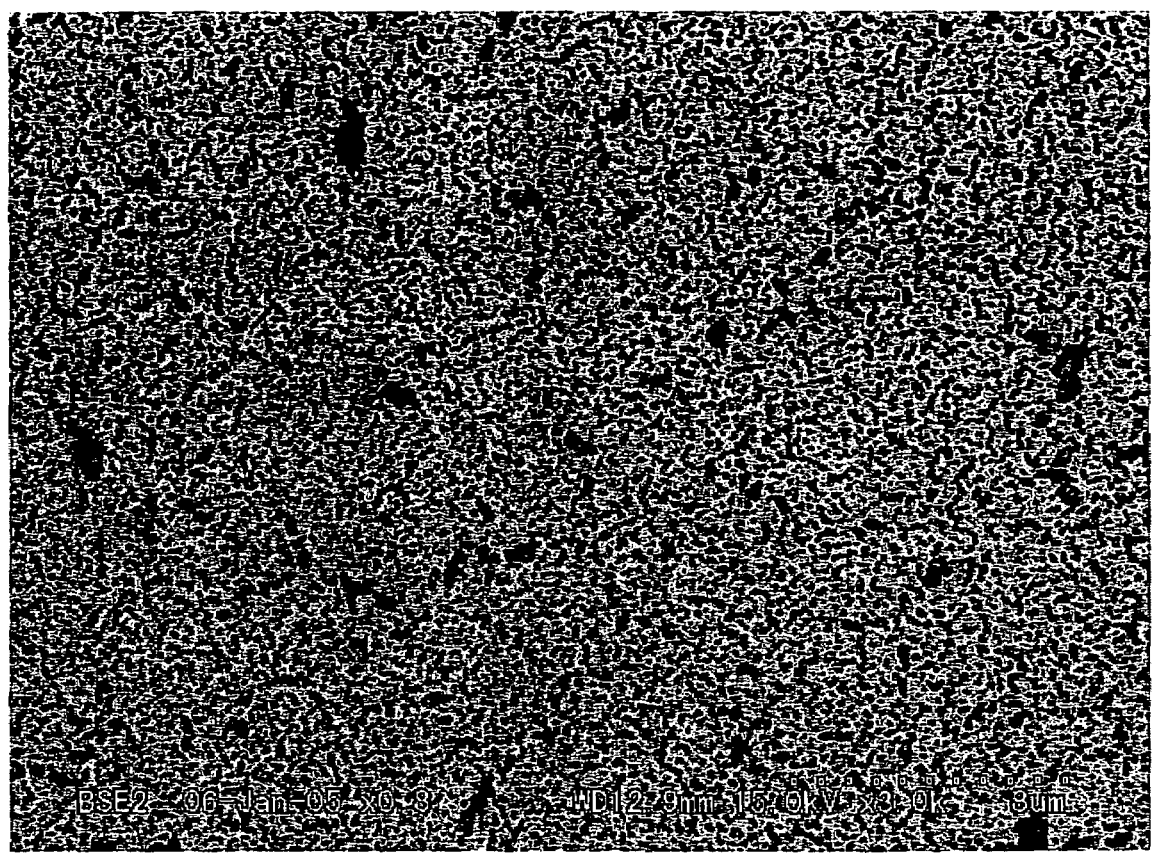
FIG. 7 is a partial enlarged view of a planar electron emitting element as a component of the electron beam irradiating apparatus according to the present invention, which is a photograph of a surface of the planar electron emitting element on a first electrode side.
Figure 8:
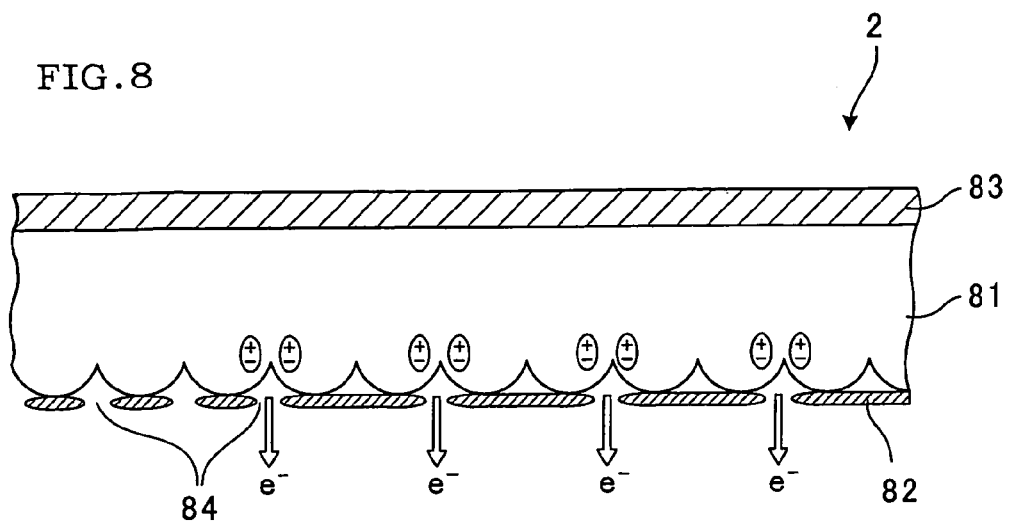
FIG. 8 shows one mode of a planar electron emitting element as a component of the electron beam irradiating apparatus according to the present invention, which is a partial enlarged sectional view of the planar electron emitting element.

FIG. 1 is a sectional view of an electron beam irradiating apparatus according to a first embodiment of the present invention. FIGS. 7 and 8 are partial enlarged views of a planar electron emitting element as a component of the electron beam irradiating apparatus according to the present invention. FIG. 7 is a photograph showing a surface of the planar electron emitting element on the first electrode side. FIG. 8 is a partial sectional view of the planar electron emitting element. In FIG. 7, black portions represent through-holes.

Figure 6:
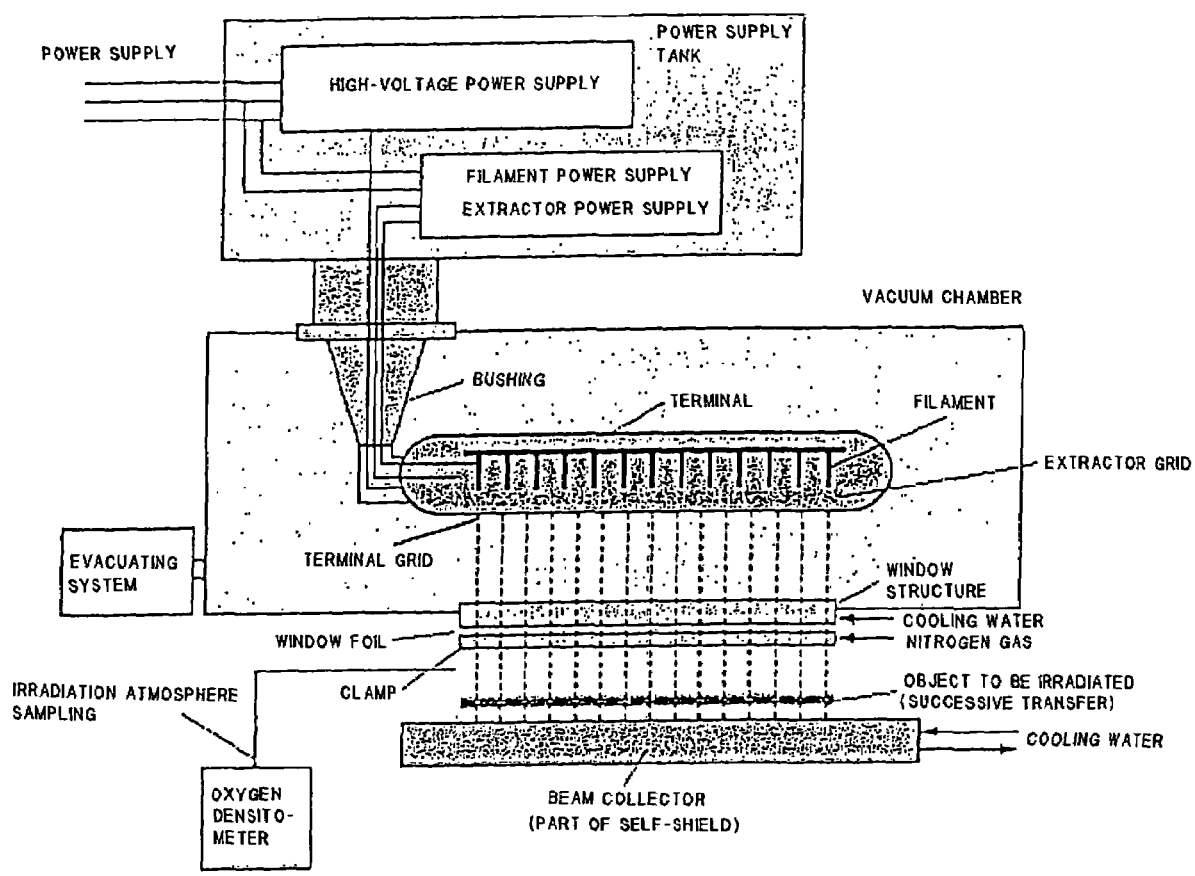
FIG. 6 is a diagram showing an example of a conventional electron beam irradiating apparatus.

An electron beam irradiating apparatus 1 shown in FIG. 1 includes a planar electron emitting element for generating and emitting an electron beam 11, an object to be irradiated 12 (for example, wafer on which a porous silicon oxide film is formed) which is irradiated with the electron beam 11, and a stage 3 (positioning means) where the object to be irradiated is mounted. The element, the object to be irradiated, and the stage are provided in a chamber 4 that is kept under vacuum. The planar electron emitting element 2 and the stage 3 on which the object to be irradiated 12 is mounted is provided in one chamber 4. The planar electron emitting element 2 is supported by a supporting member 7, and faces to the object to be irradiated 12 on the stage 3. The electron beam is directly applied to the object tog be irradiated 12. The apparatus does not have window portions (window foil and window structure) unlike a conventional electron beam irradiating apparatus (see FIG. 6).

In the electron beam irradiating apparatus 1, the planar electron emitting element 2 includes an emitter portion 81 composed of a dielectric material, and a first electrode 82 and a second electrode 83 applied with a driving voltage for emitting electrons ($e^-$) as shown in FIG. 8. The first electrode 82 is formed on a first surface (lower surface in FIG. 8) of the emitter portion 81, and the second electrode 83 is formed on a second surface (upper surface in FIG. 8) of the emitter portion 81. The first electrode 82 has plural through-holes 84 where the emitter portion 81 is exposed. A surface of the first electrode 82 facing to the emitter portion 81 around the through-holes 84 is separated from the emitter portion 81 (see FIG. 8). In the electron beam irradiating apparatus 1, a pulsed electron beam is emitted to the object to be irradiated 12 through the through-holes 84 from the first surface of the emitter portion 81. Incidentally, as the planar electron emitting element 2, an element as disclosed in JP-A-2005-142134 may be adopted.

Here, a material for the planar electron emitting element 2 is described. The dielectric material composing the emitter portion 81 is preferably a dielectric material having a relatively high dielectric constant, for example, 1,000 or more. Examples of the dielectric material include barium titanate and in addition, lead zirconate, lead magnesium niobate, lead nickel niobate, lead zinc niobate, lead manganese niobate, lead magnesium tantalate, lead nickel tantalate, lead antimony stannate, lead titanate, lead magnesium tungstate, and lead cobalt niobate, or ceramics containing an arbitrary combination thereof, a substance mainly containing 50 wt % or more of these compounds, and these compounds appropriately added with oxides of lanthanum, calcium, strontium, molybdenum, tungsten, barium, niobium, zinc, nickel, and manganese, a combination thereof, or other compounds.

For example, in a two-component of lead magnesium niobate (PMN) and lead titanate (PT) which may be shown by the formula nPMN-mPT wherein n and m represent a molar ratio, respectively, if a molar ratio of the PMN is increased, the Curie point is lowered, so a dielectric constant at room temperature may be increased. In particular, under the conditions that n=0.85 to 1.0, and m=1.0−n, the dielectric constant is 3,000 or more, which is preferred. For example, under the conditions that n=0.91, and m=0.09, the dielectric constant of 15,000 is attained at room temperature. Under the conditions that n=0.95, and m=0.05, the dielectric constant of 20,000 is attained at room temperature.

Next, in a three-component compound of lead magnesium niobate (PMN), lead titanate (PT), and lead zirconate (PZ), a dielectric constant may be increased by increasing the molar ratio of PMN and in addition, adopting a composition close to a morphotropic phase boundary (MPB) between tetragon and pseudo-tetragon and between the tetragon and rhombohedral system. For example, provided that PMN:PT:PZ=0.375:0.375:0.25, the dielectric constant is 5,500. Provided that PMN:PT:PZ=0.5:0.375:0.125, the dielectric constant is 4,500, which is particularly preferred. Further, it is preferable to improve a dielectric constant by mixing metal such as platinum into the dielectric material within such a range as to ensure an insulating property. In this case, for example, platinum is mixed into the dielectric material with a weight ratio of 20%.

Further, among the dielectric materials, a piezoelectric/electrostrictive substance or ferroelectric substance, or antiferroelectric substance may be used for the emitter portion 81.

In the case of using the piezoelectric/electrostrictive substance for the emitter portion 81, examples of the piezoelectric/electrostrictive substance includes lead zirconate, lead magnesium niobate, lead nickel niobate, lead zinc niobate, lead manganese niobate, lead magnesium tantalate, lead nickel tantalate, lead antimony stannate, lead titanate, lead magnesium tungstate, and lead cobalt niobate, or ceramics containing an arbitrary combination thereof. Needless to say, a substance mainly containing 50 wt % or more of these compounds may be used. Among the ceramics, a ceramic containing lead zirconate is most frequently used as the piezoelectric/electrostrictive substance for the emitter portion 81.

In the case of using the ceramics for the piezoelectric/electrostrictive substance, ceramics may be appropriately added with oxides of lanthanum, calcium, strontium, molybdenum, tungsten, barium, niobium, zinc, nickel, and manganese, a combination thereof, or other compounds when in use. Further, the ceramics may be adds with $SiO_2$, $CeO_2$, and $Pb_5Ge_3O_{11}$, or a combination thereof when in use. More specifically, a material prepared by adding 0.2 mass % of $SiO_2$, 0.1 mass % of $CeO_2$, or 1 to 2 mass % of $Pb_5Ge_3O_{11}$ to the PT-PZ-PMN piezoelectric material is preferred. For example, it is preferable to use a ceramic mainly containing lead magnesium niobate, lead zirconate, and lead titanate, and containing lanthanum or strontium. The piezoelectric/electrostrictive substance may be dense or porous. If the substance is porous, its porosity is preferably 40% or less.

In the case of using the antiferroelectric substance for the emitter portion 81, it is preferable to use as the antiferroelectric substance a material mainly containing lead zirconate, a material mainly containing lead zirconate and lead stannate, lead zirconate added with lanthanum oxide, and a compound of lead zirconate and lead stannate added with lead zirconate and lead niobate. Further, antiferroelectric substance may be dense or porous. If the substance is porous, its porosity is preferably 30% or less.

Further, in the case of strontium bismuth tantalate ($SrBi_2Ta_2O_9$), polarization reversal fatigue is preferably small. Such a material with small polarization reversal fatigue is a layered ferroelectric compound represented by a general formula of $(BiO2)^{2+}(A_{m-1}B_mO^3_{m+1})^{2-}$. Here, an ion of metal A is $Ca^{2+}$, $Sr^{2+}$, $Ba^{2+}$, $Pb^{2+}$, $Bi^{3+}$, or $La^{3+}$. An ion of metal B is $Ta^{4+}$, $Ta^{5+}$, or $Nb^{5+}$. Further, the sintering temperature may be lowered by mixing, for example, a glass component such as borosilicate lead glass or other low-melting-point compound (such as bismuth oxide) into piezoelectric/electrostrictive/ferroelectric/antiferroelectric ceramics.

In the case of using the piezoelectric/electrostrictive/ferroelectric/antiferroelectric ceramics, the ceramic may be formed into a sheet-like form or a sheet-like laminate, or may be laminated or bonded onto the other supporting substrate. Further, a non-lead material is used for the emitter portion 81 and a material having a high melting point and transpiration temperature is used for the emitter portion 81, so the emitter portion is hardly damaged by the collision of electrons or ions. Further, aluminum nitride may be used for the emitter portion 81.

In the electron beam irradiating apparatus 1, the planar electron emitting element 2 has a number of through-holes 84 corresponding to portions for generating and emitting electron beams as shown in FIG. 7. As for the electron beam irradiating apparatus 1, the average porosity of the through-holes 84 is about 20%, and the average diameter of the through-holes 84 is about 3 μm.

The electron beam irradiating apparatus 1 includes evacuating means 13 for evacuating the chamber 4 including the planar electron emitting element 2 and the stage 3 and keeping the vacuum atmosphere. Further, the electron beam irradiating apparatus 1 includes a power supply device 13 for applying a driving voltage to the first electrode 82 and the second electrode 83.

A waveform of the driving voltage applied to the first electrode 82 and the second electrode 83 will be described. The first electrode 82 is kept at a potential equivalent to that of the vacuum chamber 4, and a potential of the second electrode 83 is changed. Here, in a case where the potential of the second electrode 83 is higher than that of the first electrode 82, a positive voltage is assumed to be applied; otherwise, a negative voltage is applied. First, after applying the positive voltage, the negative voltage is applied, whereby electrons are emitted from the element. This operation is repeated to realize the pulsed electron emission. The energy of the emitted electron mainly depends on the negative voltage. By setting a large absolute value therefor, the energy of the emitted electrons may be increased under the control. The electron emission amount per pulse may be controlled based on the negative voltage and the positive voltage. Further, the electron emission amount per unit time (that is, average current value) or the total electron emission amount may be adjusted in accordance with the applied pulse frequency or the number of pulses (see JP-A-2005-142134).

The stage 3 on which the object to be irradiated 12 is amounted has a rotating mechanism 5. If the rotating mechanism 5 is rotated, the object to be irradiated 12 is loaded into the chamber 4 together with the stage 3 or unloaded from the chamber 4. An inlet/outlet for loading/unloading the object to be irradiated 12 and the stage is composed of a shutter 6 provided in an opening of the chamber 4, and the shutter opens/closes in step with the rotating mechanism 5.

In the electron beam irradiating apparatus 1, the film modifying process may be carried out as follows, for example. That is, the shutter 6 is first opened, and the stage 3 is moved to the outside of the chamber 4 in accordance with the rotation of the rotating mechanism 5. Then, a wafer (object to be irradiated 12) which is held by a robot hand or the like and on which a porous silicon oxide film is formed, for example, is transferred from other conveying device and mounted onto the stage 3. Then, the stage 3 having the wafer set thereon is loaded into the chamber 4 by means of the rotating mechanism 5. The shutter 6 is closed to seal the chamber 4. Next, the evacuating means 13 evacuates the chamber 4 up to a desired vacuum degree. Then, the voltage of 100 V to 1,000 V is applied to cause the planar electron emitting element 2 to emit electron beams. The electron beams are applied to the wafer for a predetermined period. Hence, the silicon oxide film on the wafer is modified, and attains high mechanical strength albeit being porous. By changing a level of the applied driving voltage, the depth of the silicon oxide film to which the electrons reach may be changed. If a mechanical strength obtained by modifying only a surface portion suffices for the purpose, the beam may be applied with a lower voltage. After the completion of the irradiation with the electron beam, the chamber 4 is returned to the atmospheric pressure, and then the shutter 6 is opened. The stage 3 together with the processed wafer is unloaded from the chamber 4 by means of the rotating mechanism 5. Then, the robot hand holds the wafer and transfers the wafer onto the other conveying device. These processes are repeated.

Figure 2:
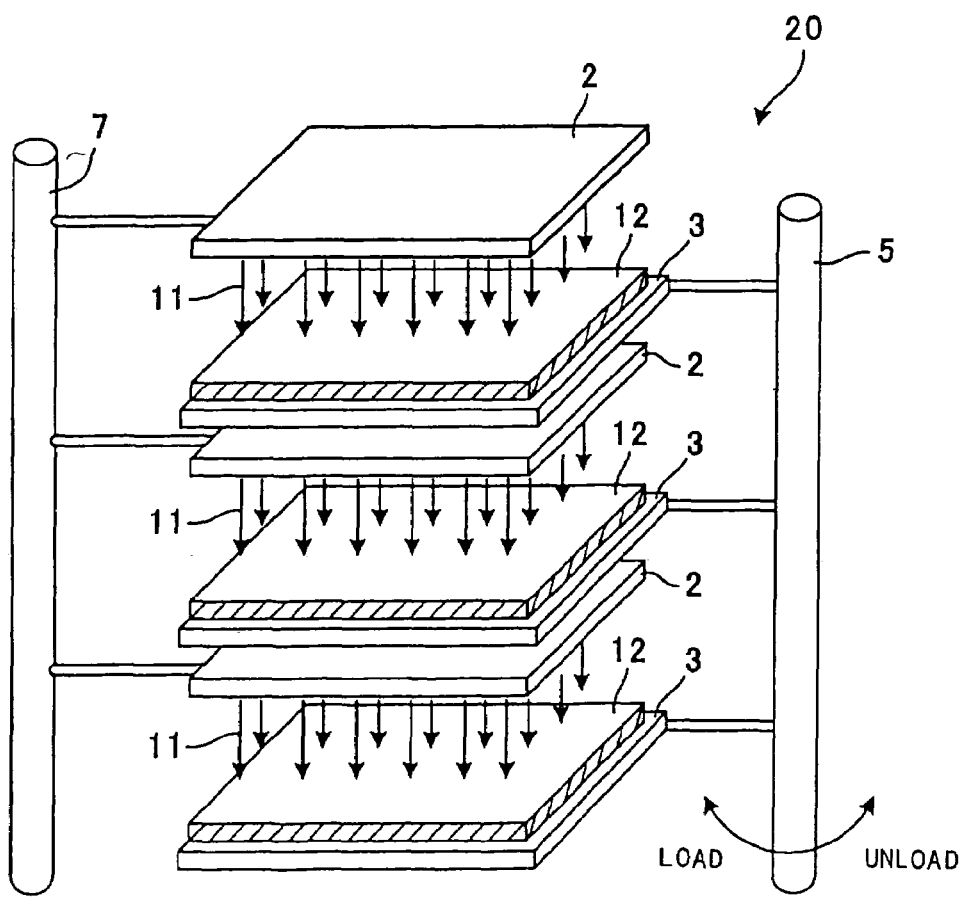
FIG. 2 is a sectional view of an electron beam irradiating apparatus according to a second embodiment of the present invention.
Figure 9:
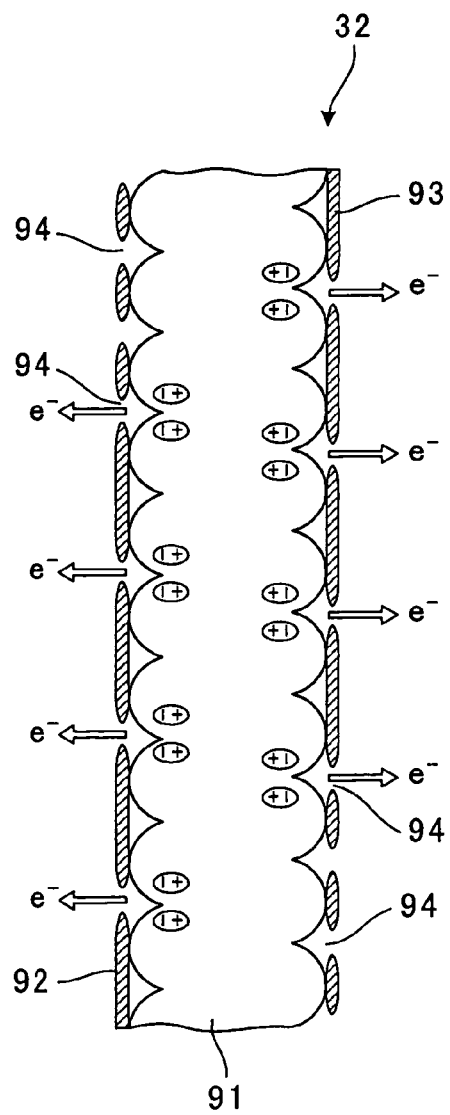
FIG. 9 shows another mode of the planar electron emitting element as a component of the electron beam irradiating apparatus according to the present invention, which is a partial enlarged sectional view of the planar electron emitting element.

FIGS. 2 to 5 are perspective views showing an electron beam irradiating apparatus according to another embodiment of the present invention. FIG. 9 shows another mode of the planar electron emitting element as a component of the electron beam irradiating apparatus according to the present invention, which is a partial enlarged view of the planar electron emitting element. An electron beam irradiating apparatus 20 according to a second embodiment of the invention as shown in FIG. 2 is based on the electron beam irradiating apparatus 1 of the first embodiment, and includes three (three pairs of) planar electron emitting elements 2 for generating and emitting the electron beam 11 and stages 3 (positioning means) where the object to be irradiated 12 applied with the electron beam 11 is mounted. These three pairs are provided in a chamber being kept under vacuum. Although the chamber and shutter are not shown in FIG. 2, the electron beam irradiating apparatus 20 has rotating mechanism 5, and the object to be irradiated 12 may be loaded/unloaded together with the stage 3 to/from the chamber 4 along with the rotation of the rotating mechanism 5. This operation is the same as that of the electron beam irradiating apparatus 1.

Figure 3:
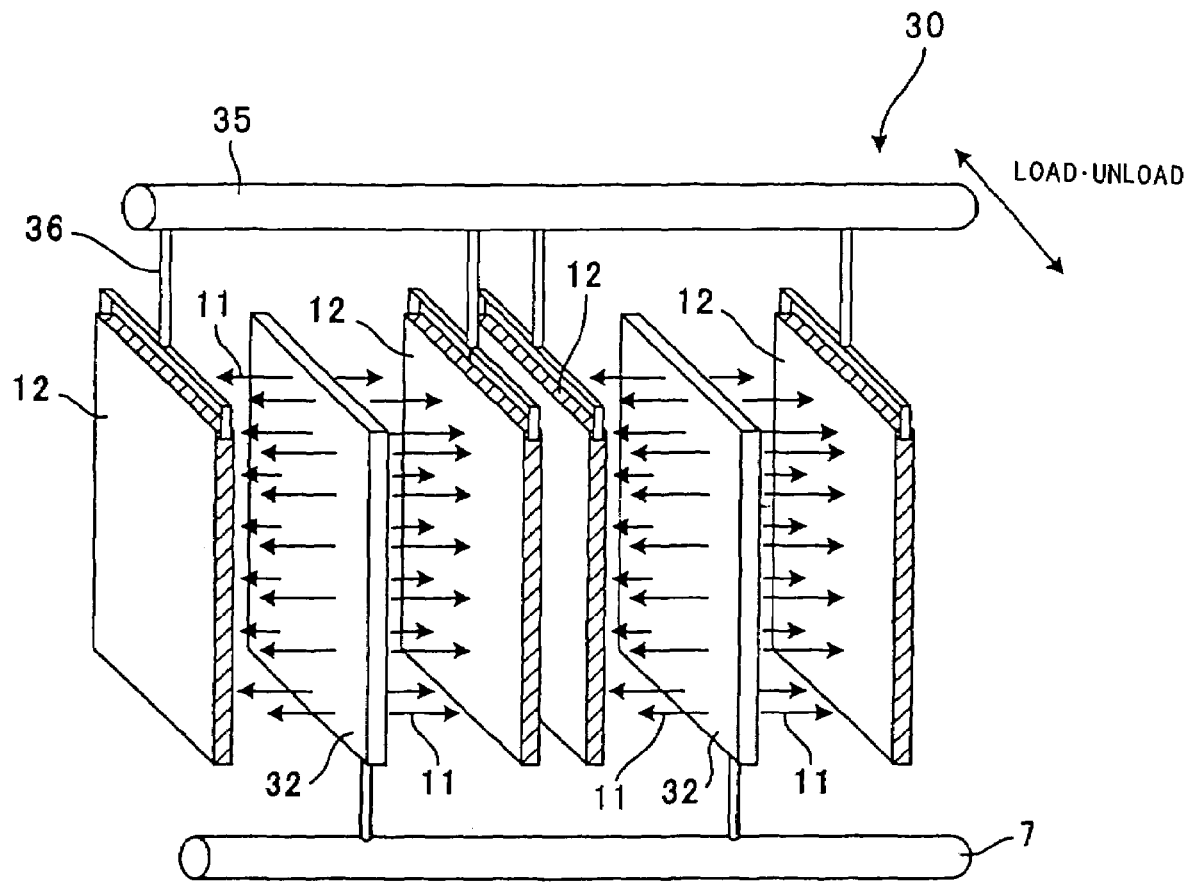
FIG. 3 is a sectional view of an electron beam irradiating apparatus according to a third embodiment of the present invention.

An electron beam irradiating apparatus 30 according to a third embodiment of the present invention as shown in FIG. 3 includes two planar electron emitting elements 32 for generating and emitting the electron beam 11, and conveying mechanisms 35 (positioning means) having four suspenders 36 that suspend the four objects to be irradiated 12. In the electron beam irradiating apparatus 30, the electron beam 11 emitted from both surfaces of the two planar electron emitting elements 32 is applied to the four objects to be irradiated 12. Although the chamber and shutter are not shown in FIG. 3, the suspended objects to be irradiated 12 may be loaded/unloaded together with the suspenders 36 to/from the chamber 4 along with the linear rotation of the conveying mechanism 35.

In the electron beam irradiating apparatus 30, an emitter portion 91 of the electron emitting elements 32 has a sheet-like shape having two surfaces from which electrons (e⁻) are emitted. The planar electron emitting elements 32 include the emitter portion 91 composed of a dielectric material, and a first electrode 92 and a second electrode 93 applied with the driving voltage for emitting the electrons (e⁻). The first electrode 92 is formed on a first surface (left surface in FIG. 9) of the emitter portion 91, and the second electrode 93 is formed on a second surface (right surface in FIG. 9) of the emitter portion 91. The first electrode 92 and the second electrode 93 have plural through-holes 94 where the emitter portions 91 are exposed. A surface of the first electrode 92 or the second electrode 93 facing to the emitter portion 91 around the through-holes 94 is separated from the emitter portion 91 (see FIG. 9). In the electron beam irradiating apparatus 30, the electron beam is emitted in the pulsed form to the object to be irradiated 12 through the through-holes 94 from the first and second surfaces of the emitter portion 91.

Figure 4:
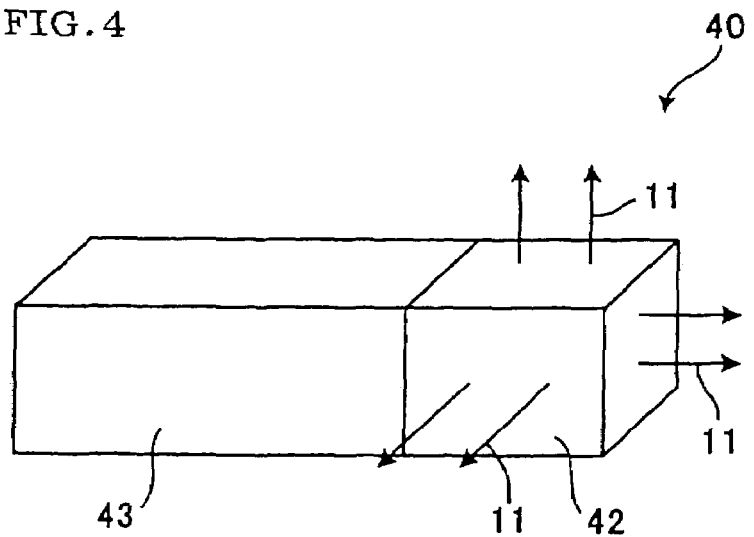
FIG. 4 is a sectional view of an electron beam irradiating apparatus according to a fourth embodiment of the present invention.

FIG. 4 only shows a planar electron emitting element 42 and a supporting member 43 for supporting the element in an electron beam irradiating apparatus 40 according to a fourth embodiment of the invention. The planar electron emitting element 42 of FIG. 4 has a polyhedral surface for emitting the electron beams 11. The polyhedral surface forms rectangle. The electron beam 11 may be emitted to five directions (except the supporting member 43 side). In the planar electron emitting element 42, a first electrode is formed on an outer surface of the inner emitter portion. A second electrode is formed inside the emitter portion. In the electron beam irradiating apparatus 40 thus configured, for example, a robot hand is placed in a chamber for holding the supporting member 43 to control the direction of the planar electron emitting element 42, whereby the electron beam may be applied in every directions to the object to be irradiated that is loaded in the chamber. Accordingly, a desired change in physical property may be caused for any potion of the object to be irradiated by adjusting the irradiation time of the electron beam or driving voltage in combination.

Figure 5:
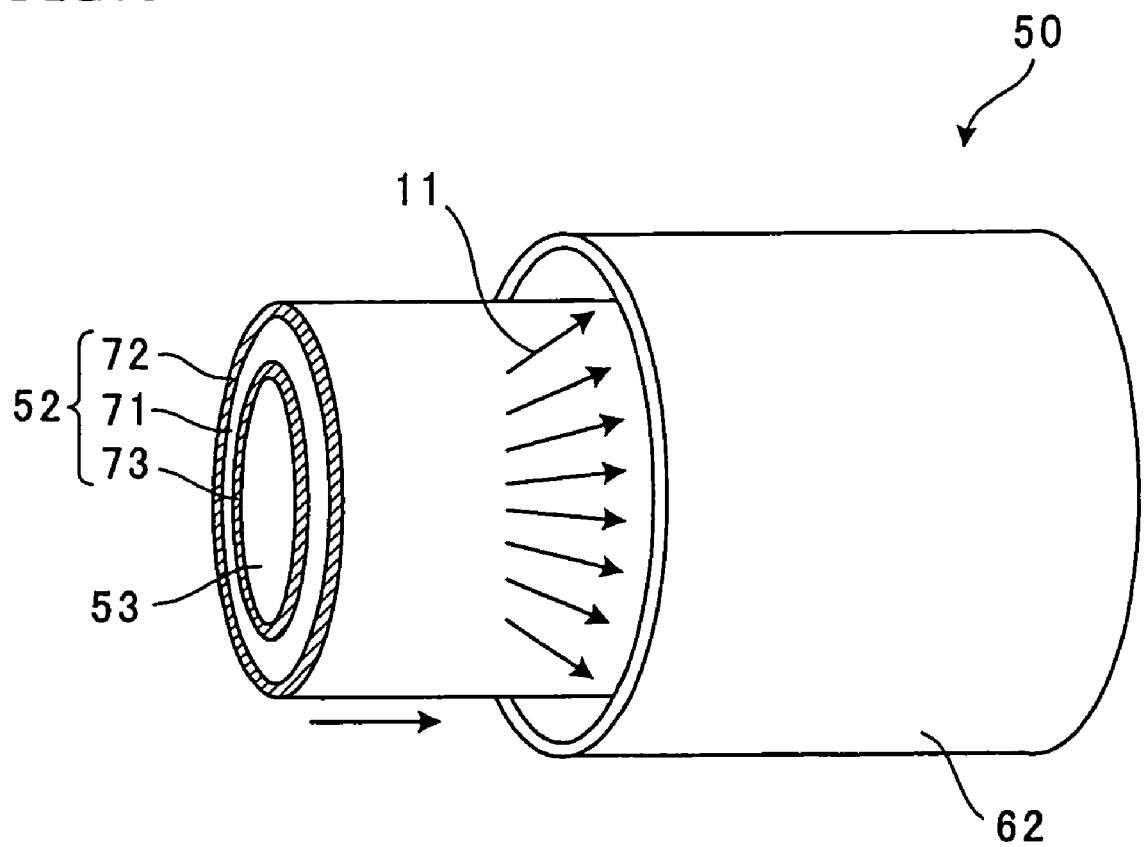
FIG. 5 is a sectional view of an electron beam irradiating apparatus according to a fifth embodiment of the present invention.

FIG. 5 only shows a planar electron emitting element 52, a supporting member 53 for supporting the element, and an object to be irradiated 62 in an electron beam irradiating apparatus 50 according to a fifth embodiment of the invention. The planar electron emitting element 52 of FIG. 5 is prepared by laminating a second electrode 73, an emitter portion 71, and a first electrode 72 in this order on an outer peripheral surface of the cylindrical supporting member 53, and thus the element itself has a cylindrical shape. A surface for emitting the electron beam 11 of the planar electron emitting element 52 on a first electrode side is curved. Thus, the electron beam 11 may be emitted rotationally. In the electron beam irradiating apparatus 50, for example, a conveying mechanism that moves linearly is placed in the chamber, and the supporting member 53 is fixed thereto to move the planar electron emitting element 52. Hence, it is possible to apply the electron beam to an inner surface of the cylindrical object to be irradiated 62 loaded into the chamber.

Figure 10A:
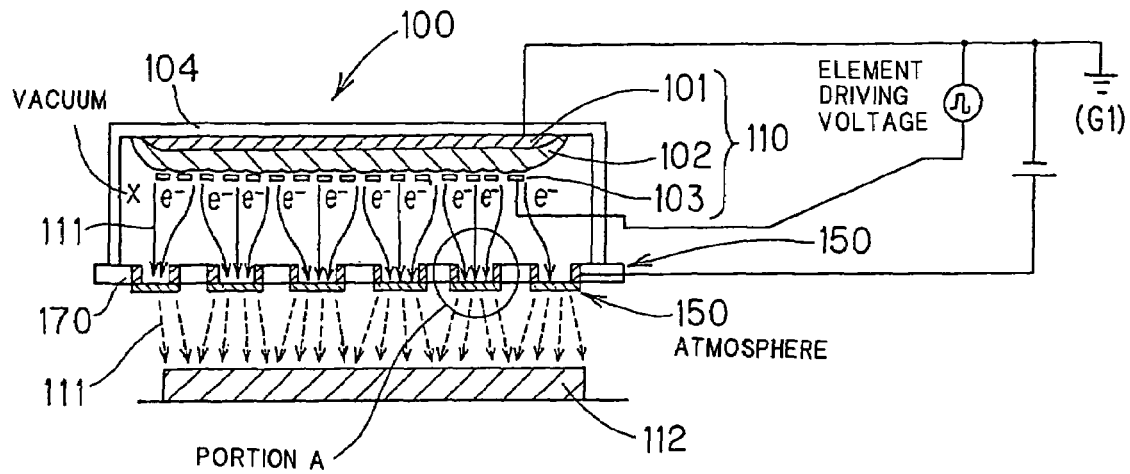
FIG. 10(*a*) is a sectional view of an electron beam irradiating apparatus according to a sixth embodiment of the present invention, FIG. 10(*b*) is a partial enlarged view of a portion A in FIG. 10(*a*), and FIG. 10(*c*) is a plan view showing how window portions of FIG. 10(*a*) are arranged.
Figure 10B:
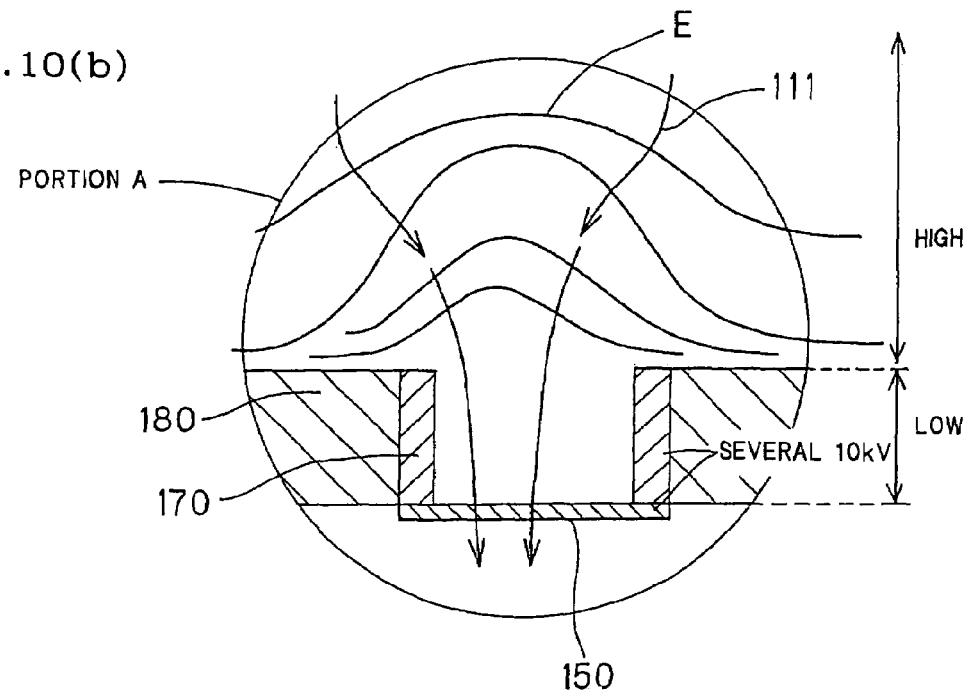
Figure 10C:
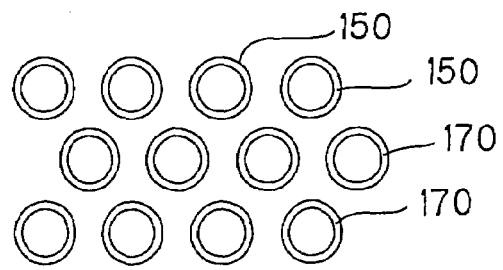

FIG. 10(a) is a sectional view showing an electron beam irradiating apparatus according to a sixth embodiment of the present invention. FIG. 10(b) is a partial enlarged view of a portion A of FIG. 10(a). FIG. 10(c) is a plan view showing how the window portions are arranged in FIG. 10(a). As shown in FIGS. 10(a) to 10(c), in an electron beam irradiating apparatus of this embodiment, an object to be irradiated 112 is placed in the atmosphere outside the chamber 104. The chamber 104 has, on the side facing to the object to be irradiated 112, plural window portions 150 through which the electron beam 111 is transmitted and emitted to the atmosphere, an electron accelerating and orbit controlling electrode 170 arranged around each window portion 150, and an insulating flange for fixing and supporting the window portions 150 and the electron accelerating and orbit controlling electrode 170 while keeping the chamber 104 under vacuum. The electron beam 111 emitted from the planar electron emitting element 110 is accelerated by the electron accelerating and orbit controlling electrode 170 and concentratedly guided to the window portion 150 to pass through the window portion 150 and planarly applied to the object to be irradiated 112. Here, a material for each component may be the same as that of the above embodiments. In FIG. 10(a), reference numeral 101 denotes a lower electrode; 102, a ferroelectric layer; and 103, an upper electrode.

As shown in FIGS. 10(a) and 10(b), the orbit of the electron beam 111 emitted from the planar electron emitting element 110 is controlled by an electric field E generated by the electron accelerating and orbit controlling electrode 170 (the beam is controlled to travel vertically to the electric field E) to guide the beam to the window portion 150, making it possible to prevent the insulating flange portion 180 from absorbing the beam. Accordingly, an energy loss due to the absorption of the electron beam 111 may be effectively prevented. Further, the electron emitting element 110 is a planar one, so the electron beam is planarly emitted. As shown in FIG. 10(c), the window portions 150 are arranged at regular intervals throughout the entire planar electron emitting element 110. As shown in FIG. 10(a), the electron beam 111 that passes through the window portions 150 is diffused to some extent in the atmosphere while colliding with molecules. Based on this, one apparatus may planarly and uniformly apply an electron beam an object to be irradiated 112.

Figure 11:
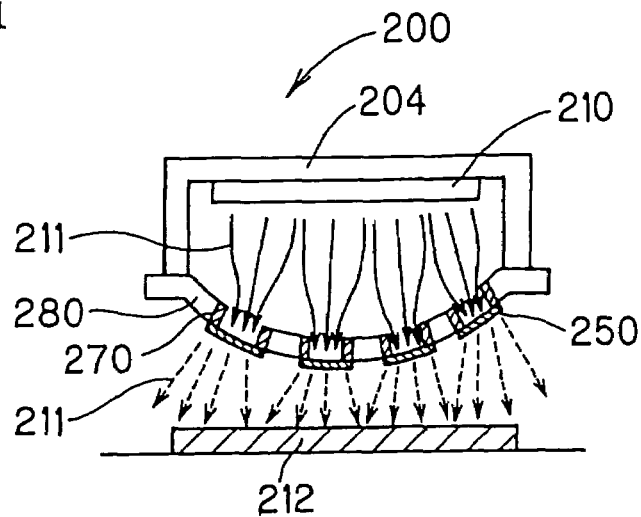
FIG. 11 is a sectional view of an electron beam irradiating apparatus according to a seventh embodiment of the present invention.

FIG. 11 is a sectional view showing an electron irradiating apparatus according to a seventh embodiment of the present invention. As shown in FIG. 11, in an electron irradiating apparatus 200 of this embodiment, an insulating flange portion 280 of the chamber 204 is formed in an arch or dome shape that protrudes to the side where an object to be irradiated 212 is arranged. Based on this structure, an electron beam 211 emitted from a planar electron emitting element 210 and transmitted through a window portion 250 may be efficiently applied to a larger area. Further, since the insulating flange portion 280 is formed in the arch or dome shape, the thickness of the insulating flange portion 280 necessary for keeping the vacuum atmosphere relative to the atmospheric pressure may be reduced, enabling a lightweight apparatus.

Figure 12:
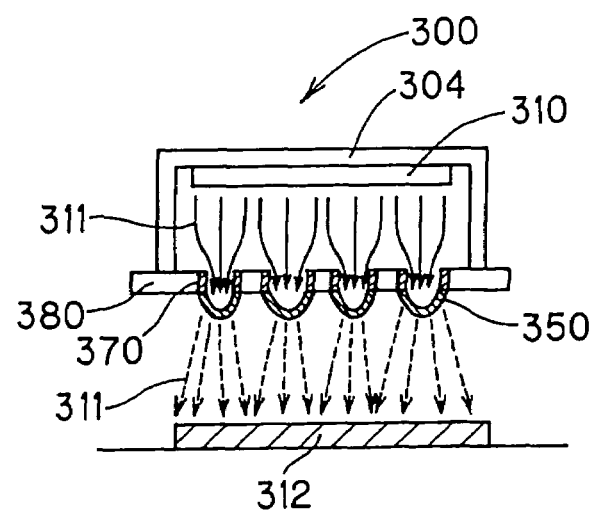
FIG. 12 is a sectional view of an electron beam irradiating apparatus according to an eighth embodiment of the present invention.

FIG. 12 is a sectional view showing an electron irradiating apparatus according to an eighth embodiment of the present invention. As shown in FIG. 12, in an electron irradiating apparatus 300 of this embodiment, a window portion 350 supported by an insulating flange portion 380 of a chamber 304 is formed in an arch or dome shape that protrudes to the side where an object to be irradiated 312 is arranged. Hence, similar to the above example, an electron beam 311 emitted from a planar electron emitting element 310 and transmitted through the window portion 350 may be efficiently applied to a larger area, which is preferred. Further, since the window portion 350 is formed in the arch or dome shape, the thickness of the window portion 350 necessary for keeping the vacuum atmosphere relative to the atmospheric pressure may be reduced, allowing transmission of electrons of lower energy with no loss.

Figure 13:
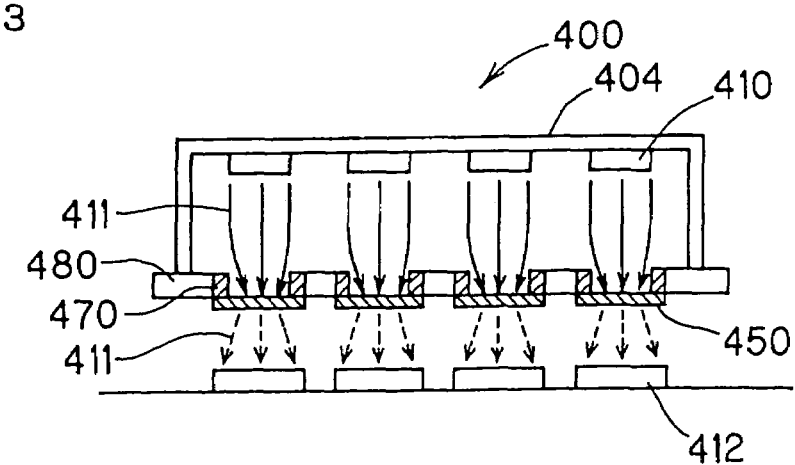
FIG. 13 is a sectional view of an electron beam irradiating apparatus according to a ninth embodiment of the present invention.

FIG. 13 is a sectional view showing an electron irradiating apparatus according to a ninth embodiment of the present invention. As shown in FIG. 13, an electron irradiating apparatus 400 of this embodiment includes plural planar electron emitting elements 410 provided in a chamber 404 and plural objects to be irradiated 412 in the atmosphere in a one-to-one correspondence. Hence, similar to the above case, an electron beam 411 emitted from the planar electron emitting element 410 and transmitted through the window portion 450 is efficiently applied to a larger area with no energy loss.

In addition to the film modifying device of the present invention, the electron beam irradiating apparatus according to the present invention is applicable to any conceivable usage to which a mechanism for changing physical properties of an object to be irradiated through irradiation with an electron beam is applied. For example, the apparatus may be used for a maskless exposing device (device for forming a fine pattern using an electron beam) used in a semiconductor manufacturing process, a scanning electron microscope (SEM), a semiconductor product tester, modification of various films based on a crosslinking reaction of polymers (resin) in the semiconductor manufacturing process or other manufacturing processes) or polymerizing reaction, a coating process and a process of drying a coated layer, and a curing process thereof. Further, the apparatus may be used as means for sterilizing or disinfecting medical device and container or decomposing and removing harmful substances such as nitride oxides or sulfur oxides in an exhaust gas that causes global warming.

What is claimed is:

1. An electron beam irradiating apparatus comprising:
a chamber being kept under vacuum;
an electron emitting element provided inside the chamber and generating and emitting an electron beam to be applied to an object to be irradiated, electron emitting element being a planar electron emitting element that has a planar electron emitting surface and may planarly apply the electron beam to the object to be irradiated, the planar electron emitting element comprising an emitter portion composed of a dielectric material, and first and second electrodes that are applied with a driving voltage for emitting electrons, wherein the first electrode is formed on a first surface of the emitter portion, the second electrode is formed on a second surface of the emitter portion, at least the first electrode has a plurality of through-holes where the emitter portion is exposed, a surface of the first electrode facing to the emitter portion around the through-holes is separated from the emitter portion, and the electron beam is emitted from at least the first surface of the emitter portion through the through-holes; and positioning means for positioning the object to be irradiated in the chamber, wherein the object to be irradiated is placed inside the chamber and directly irradiated with the electron beam emitted from the electron emitting element in a vacuum atmosphere of the chamber.

2. The electron beam irradiating apparatus according to claim 1, wherein the second electrode of the planar electron emitting element has a plurality of through-holes where the emitter portion is exposed, a surface of the second electrode facing to the emitter portion around the through-holes is separated from the emitter portion, and the electron beam is emitted from the first surface and the second surface of the emitter portion.

3. The electron beam irradiating apparatus according to claim 1, wherein the electron beam is emitted in a pulsed form from the planar electron emitting element.

4. The electron beam irradiating apparatus according to claim 1, wherein the first surface or the second surface of the emitter portion of the planar electron emitting element, which emits the electron beams is at least one of a curved surface and a polyhedral surface.

5. The electron beam irradiating apparatus according to claim 1, wherein an average diameter of the through-holes is in the range of 0.01 to 100 μm.

6. The electron beam irradiating apparatus according to claim 5, wherein an average porosity of the though-holes is in the range of 5 to 60%.

7. The electron beam irradiating apparatus according to claim 1, wherein at least one of a plurality of the planar electron emitting elements and a plurality of the positioning means are provided in the chamber maintained under vacuum.

8. The electron beam irradiating apparatus according to claim 1, wherein the object to be irradiated is placed in the atmosphere outside the chamber, the chamber includes: a plurality of window portions through which the electron beam is transmitted to the atmosphere and which are provided on a side facing to the object to be irradiated; electron accelerating and orbit controlling electrodes arranged around each of the window portions; and an insulating flange portion for fixing and supporting the window portions and the electron accelerating and orbit controlling electrodes in the chamber being kept under vacuum, and the electron beam emitted from the planar electron emitting element is accelerated by the electron accelerating and orbit controlling electrodes, concentratedly guided to the window portions, and transmitted through the window portions and then planarly applied to the object to be irradiated.

9. The electron beam irradiating apparatus according to claim 8, wherein the window portions are arranged at substantially regular intervals throughout the entire electron emitting surface of the planar electron emitting element.

10. The electron beam irradiating apparatus according to claim 8, wherein the insulating flange portion of the chamber has an arch or dome shape that protrudes to a side on which the object to be irradiated is arranged.

11. The electron beam irradiating apparatus according to claim 8, wherein the window portion has an arch or dome shape that protrudes to a side on which the object to be irradiated is arranged.

12. The electron beam irradiating apparatus according to claim 8, wherein the insulating flange portion of the chamber has an arch or dome shape that protrudes to a side on which the object to be irradiated is arranged.

13. A film modifying device comprising a chamber being kept under vacuum, and an electron emitting element provided inside the chamber and generating and emitting an electron beam to be applied to an object to be irradiated, the electron emitting element being a planar electron emitting element having a planar electron emitting surface and being capable of planarly applying the electron beam to the object to be irradiated, wherein the object to be irradiated is a film that is placed in the atmosphere outside the chamber;

wherein the chamber comprises a plurality of window portions through which the electron beam is transmitted to the atmosphere and which are provided on a side facing to the object to be irradiated; electron accelerating and orbit controlling electrodes arranged around each of the window portions; and an insulating flange portion for fixing and supporting the window portions and the electron accelerating and orbit controlling electrodes with the chamber being kept under vacuum; and wherein the electron beam emitted from the planar electron emitting element is accelerated by the electron accelerating and orbit controlling electrodes, concentratedly guided to the window portions, and transmitted through the window portions and then planarly applied to the film.

14. The film modifying device according to claim 13, wherein the film as the object to be irradiated is irradiated with the electron beam and made porous.

15. The film modifying device according to claim 13, wherein the film as the object to be irradiated is irradiated with the electron beam to make the film porous and improve at least one of a mechanical strength and interfacial adhesion of the porous film.

16. The film modifying device according to claim 13, wherein the film as the object to be irradiated is a porous film, and the porous film is irradiated with the electron beam to improve at least one of a mechanical strength and interfacial adhesion of the porous film.

17. The film modifying device according to claim 13, wherein the object to be irradiated is irradiated to improve at least one of a mechanical strength and interfacial adhesion of the film.

* * * * *